(12) United States Patent
Xia

(10) Patent No.: US 12,262,618 B2
(45) Date of Patent: Mar. 25, 2025

(54) FLEXIBLE DISPLAY DEVICE

(71) Applicant: Shenzhen China Star Optoelectronics Semiconductor Display Technology Co., Ltd., Guangdong (CN)

(72) Inventor: Rong Xia, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/607,507

(22) PCT Filed: Oct. 12, 2021

(86) PCT No.: PCT/CN2021/123283
§ 371 (c)(1),
(2) Date: Oct. 29, 2021

(87) PCT Pub. No.: WO2023/044983
PCT Pub. Date: Mar. 30, 2023

(65) Prior Publication Data
US 2024/0032383 A1    Jan. 25, 2024

(30) Foreign Application Priority Data
Sep. 27, 2021 (CN) .......................... 202111136198.2

(51) Int. Cl.
*H10K 59/10* (2023.01)
*H10K 59/80* (2023.01)
*H10K 102/00* (2023.01)

(52) U.S. Cl.
CPC ....... *H10K 59/80* (2023.02); *H10K 2102/311* (2023.02)

(58) Field of Classification Search
CPC ........ H10K 59/10; H10K 59/80; H10K 77/10; H10K 77/111; H10K 2102/311; H10K 102/00; G09F 9/30; G09F 9/33; G09F 9/301
USPC .......................................................... 257/40
See application file for complete search history.

(56) References Cited

U.S. PATENT DOCUMENTS

| | | | | |
|---|---|---|---|---|
| 9,173,287 | B1* | 10/2015 | Kim | G06F 1/1652 |
| 2017/0192460 | A1* | 7/2017 | Watanabe | G02F 1/133305 |
| 2022/0101761 | A1* | 3/2022 | Gao | G09F 9/301 |

FOREIGN PATENT DOCUMENTS

| | | |
|---|---|---|
| CN | 110752232 | 2/2020 |
| CN | 111477116 | 7/2020 |
| CN | 111883573 | 11/2020 |
| CN | 112331076 | 2/2021 |

* cited by examiner

Primary Examiner — Chuong A Luu

(57) ABSTRACT

Provided is a flexible display device. The flexible display device provided by the embodiment of the present application supports and reinforces the flexible display panel by adopting an innovatively designed supporting film Compared with a traditional supporting film, the supporting film in the present application has better bending properties, so that the curling radius of the flexible display panel can be greatly reduced. In addition, the supporting film in the present application has better flexibility, so it does not easily break during use.

19 Claims, 8 Drawing Sheets

FLEXIBLE DISPLAY DEVICE

RELATED APPLICATIONS

This application is a National Phase of PCT Patent Application No. PCT/CN2021/123283 having International filing date of Oct. 12, 2021, which claims the benefit of priority of Chinese Patent Application No. 202111136198.2 filed on Sep. 27, 2021. The contents of the above applications are all incorporated by reference as if fully set forth herein in their entirety.

FILED AND BACKGROUND OF THE INVENTION

The present application relates to the field of display, and in particular, to a flexible display device.

A supporting film of a current flexible display device is usually made of stainless steel, and an elastic modulus of the stainless steel is reduced by etching and hollowing, so that the flexible display device can be curled or folded.

However, due to high hardness of stainless steel itself, even if an extreme hollowing process is used, the supporting film still has poor bending performance, and the flexible display device still has a relatively large curling radius, so there is a risk that the supporting film of the stainless steel easily breaks during a curling process. In addition, when curling a flexible display device, the flexible display device is easily damaged due to different stress (i.e., uneven stress) that is applied on an area corresponding to a hollow pattern of the supporting film and an area corresponding to a non-hollow pattern of the supporting film.

Embodiments of the present application provide a flexible display device, which has a relatively small curling radius, and a supporting film does not easily break during a curling process, thus causing no damage to the flexible display panel.

An embodiment of the present application provides a flexible display device, comprising
  a flexible display panel;
  a supporting film, the supporting film and the flexible display panel are stacked, and the supporting film is used to support the flexible display panel; and
  the supporting film comprises a flexible substrate and a plurality of metal strips, and each of the plurality of metal strips is connected with the flexible substrate.

In some embodiments, the plurality of metal strips are connected with the flexible substrate through an adhesive layer.

In some embodiments, the adhesive layer comprises a first adhesive layer and a second adhesive layer arranged at intervals, one end of each of the plurality of metal strips is connected with the flexible substrate through the first adhesive layer, and the other end of each of the plurality of metal strips is connected with the flexible substrate through the second adhesive layer.

In some embodiments, the plurality of metal strips are parallel to each other, the plurality of metal strips are cylindrical, each of the plurality of metal strips has a cross-sectional diameter of 0.2 mm to 2 mm, and a distance between centers of two adjacent metal strips is 0.7 mm to 6 mm.

In some embodiments, both the first adhesive layer and the second adhesive layer have a width of 10 mm to 30 mm along the extending direction of the metal strips, and both the first adhesive layer and the second adhesive layer have a thickness of 0.03 mm to 0.1 mm.

In some embodiments, the adhesive layer covers an entire surface of the flexible substrate.

In some embodiments, the flexible substrate is a polymer material, and the flexible substrate has a thickness of 0.1 mm to 1 mm.

In some embodiments, the flexible substrate is a polyethylene terephthalate (PET) film, and the metal strip is made of stainless steel.

In some embodiments, the flexible display panel comprises a flexible substrate and a display layer, the flexible substrate is provided on one side of the supporting film, and the display layer is provided on one side of the flexible substrate away from the supporting film.

In some embodiments, the display layer is an organic light emitting diode (OLED) display layer.

The flexible display device provided by the embodiments of the present application supports and reinforces the flexible display panel by adopting an innovatively designed supporting film, which comprises a flexible substrate and a plurality of metal strips connected with the flexible substrate. Compared with traditional supporting film, supporting film in the present application has better bending properties, so that the curl radius of the flexible display panel can be greatly reduced to less than 3 mm. In addition, since supporting film in the present application adopts a flexible substrate as a substrate, the supporting film has better flexibility, so it is not easy to break during use. Further, since the supporting film is not provided with a hollow pattern, when curling a flexible display device, stress applied on different areas of the flexible display panel is uniform, thus causing no damage to the flexible display panel.

BRIEF DESCRIPTION OF THE SEVERAL VIEWS OF THE DRAWINGS

In order to more clearly describe the technical solutions in the embodiments of the present application, hereinafter, the appended drawings used for describing the embodiments will be briefly introduced. Apparently, the appended drawings described below are only directed to some embodiments of the present application, and for a person skilled in the art, without expenditure of creative labor, other drawings can be derived on the basis of these appended drawings.

In order to have a more complete understanding of the present application and its beneficial effects, the description will be given below in conjunction with the accompanying drawings.

In the following description, the same reference numerals indicate the same parts.

FIG. 1 shows a schematic top view of a flexible display device provided by an embodiment of the present application.

FIG. 2 shows a schematic cross-sectional view of the flexible display device provided by an embodiment of the present application.

FIG. 3 shows a schematic diagram of an enlarged structure of an area C in FIG. 2.

FIG. 4 shows a first schematic top view of a supporting film provided by an embodiment of the present application.

FIG. 5 shows a schematic cross-sectional view of a structure shown in FIG. 4 along an A-A direction.

FIG. 6 shows a schematic diagram of an enlarged structure of an area B in FIG. 5.

FIG. 7 shows a second schematic top view of the supporting film provided by an embodiment of the present application.

FIG. 8 shows a schematic diagram of a curling effect of the flexible display device provided by an embodiment of the present application.

DESCRIPTION OF SPECIFIC EMBODIMENTS
OF THE INVENTION

Hereinafter, technical solution in embodiments of the present application will be clearly and completely described with reference to the accompanying drawings in embodiments of the present application. Apparently, the described embodiments are part of, but not all of, the embodiments of the present application. All the other embodiments, obtained by a person with ordinary skill in the art on the basis of the embodiments in the present application without expenditure of creative labor, belong to the protection scope of the present application.

Figure 1:
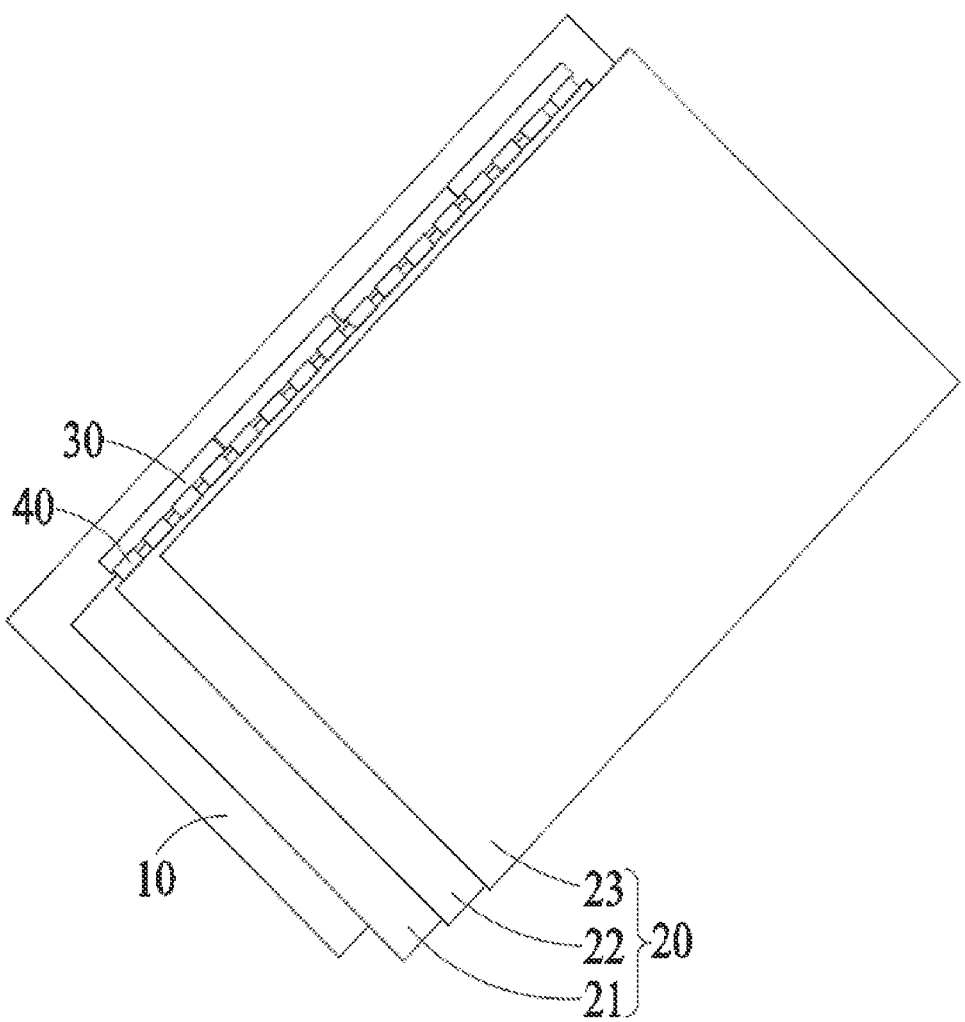
Figure 2:
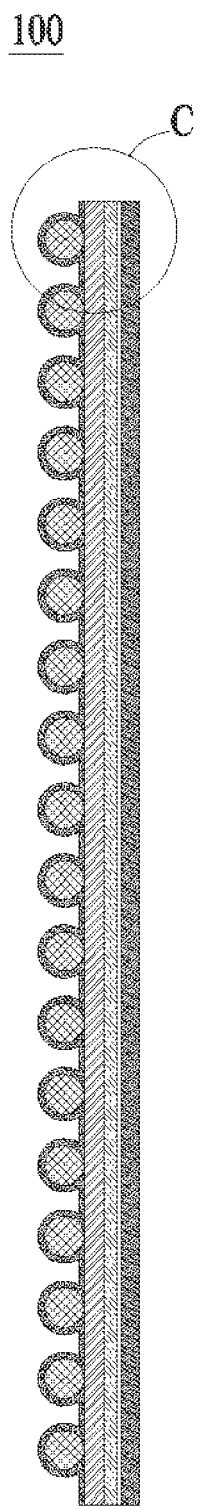
Figure 3:
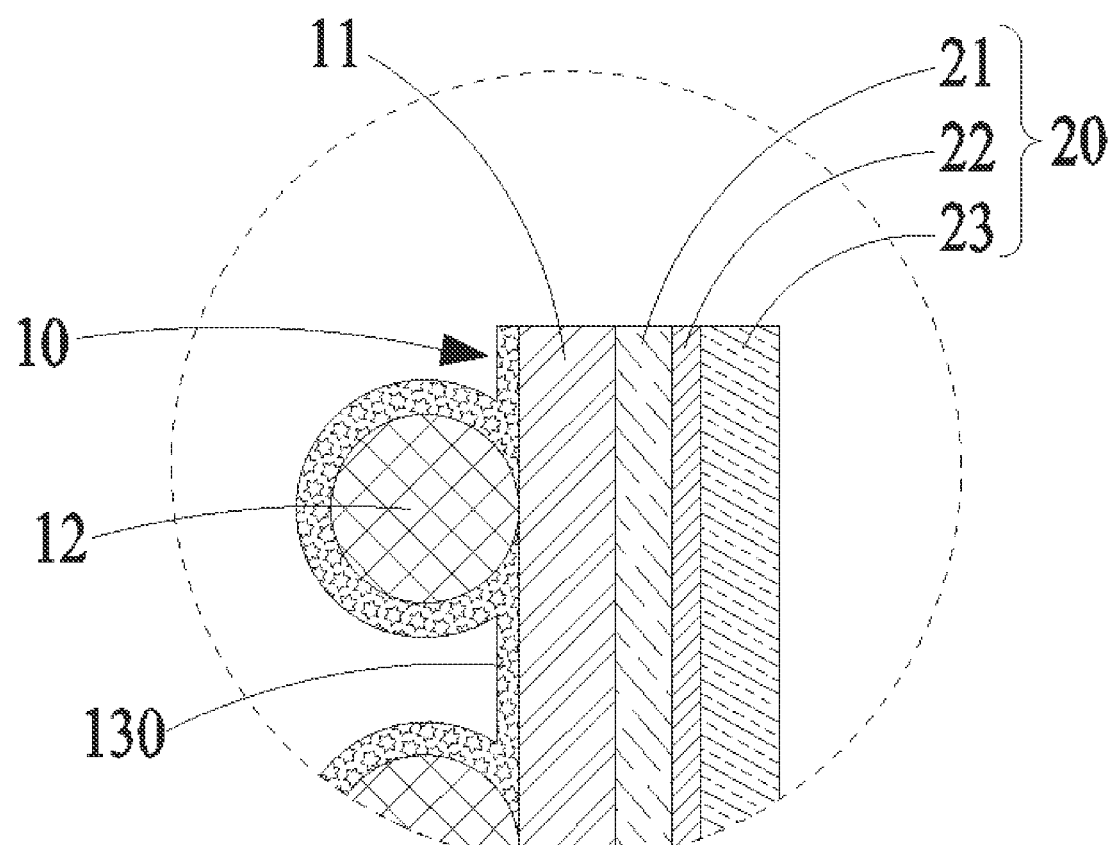

Referring to FIGS. 1-3. FIG. 1 shows a schematic top view of a flexible display device provided by an embodiment of the present application. FIG. 2 shows a schematic cross-sectional view of the flexible display device provided by an embodiment of the present application. FIG. 3 shows a schematic diagram of an enlarged structure of an area C in FIG. 2. An embodiment of the present application provides a flexible display device 100, which comprises a supporting film 10 and a flexible display panel 20 that are stacked. The flexible display panel 20 comprises a flexible substrate 21 and a display layer 22, the flexible substrate 21 is provided on one side of the supporting film 10, and the display layer 22 is provided on one side of the flexible substrate 21 away from the supporting film 10.

Illustratively, the flexible display device 100 may be an electronic device such as a mobile phone, a tablet computer, a television, a wearable device (such as a smart bracelet and a smart clothing), etc.

Figure 4:
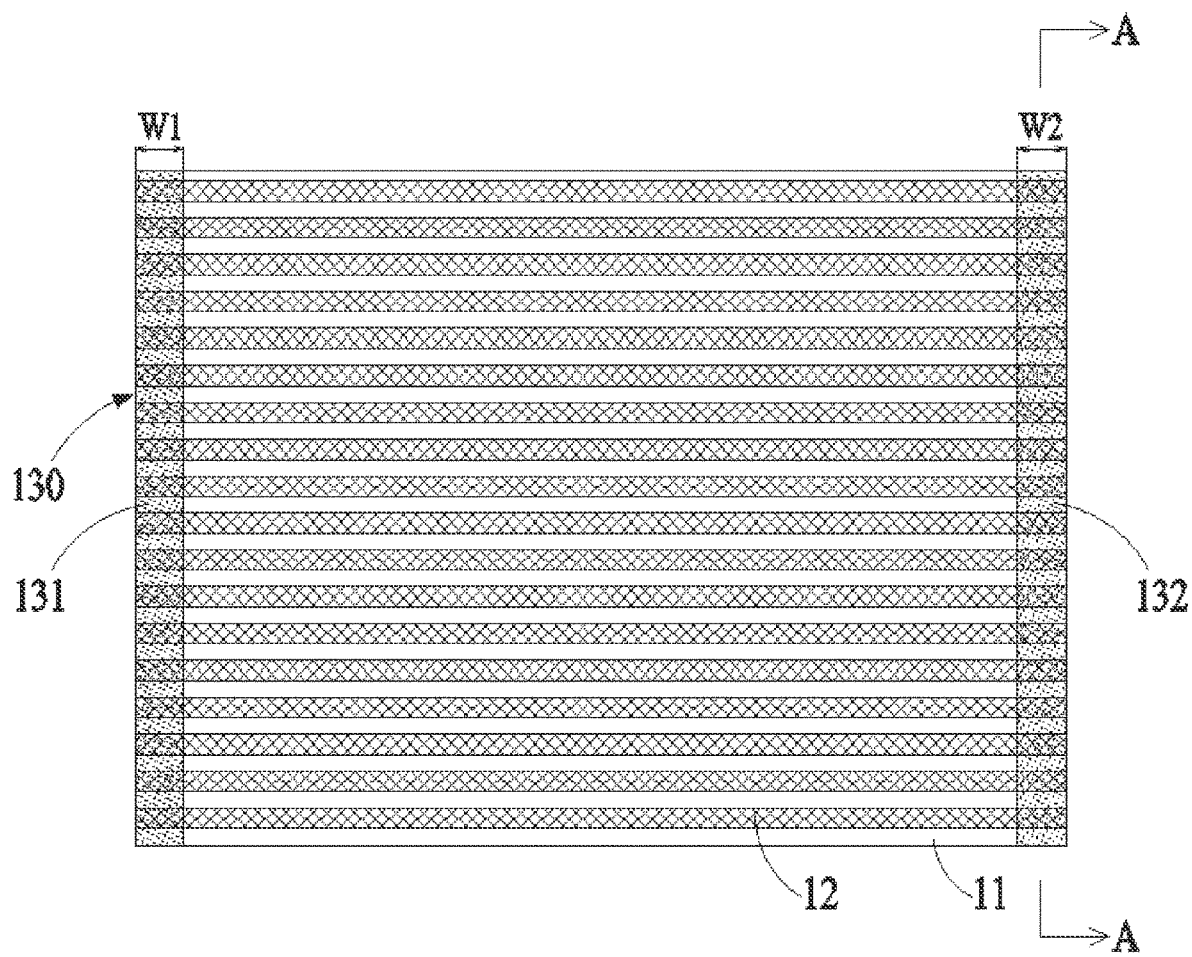
Figure 5:
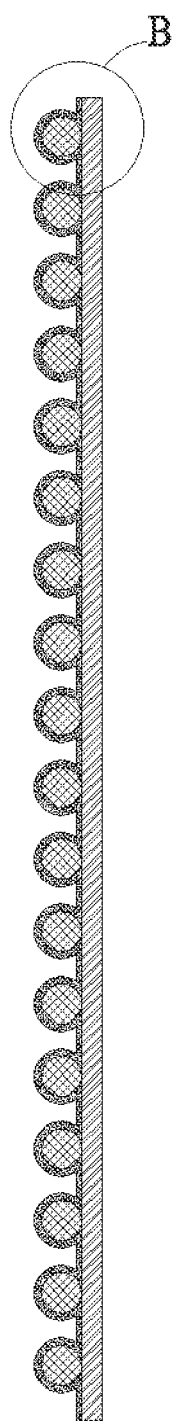
Figure 6:
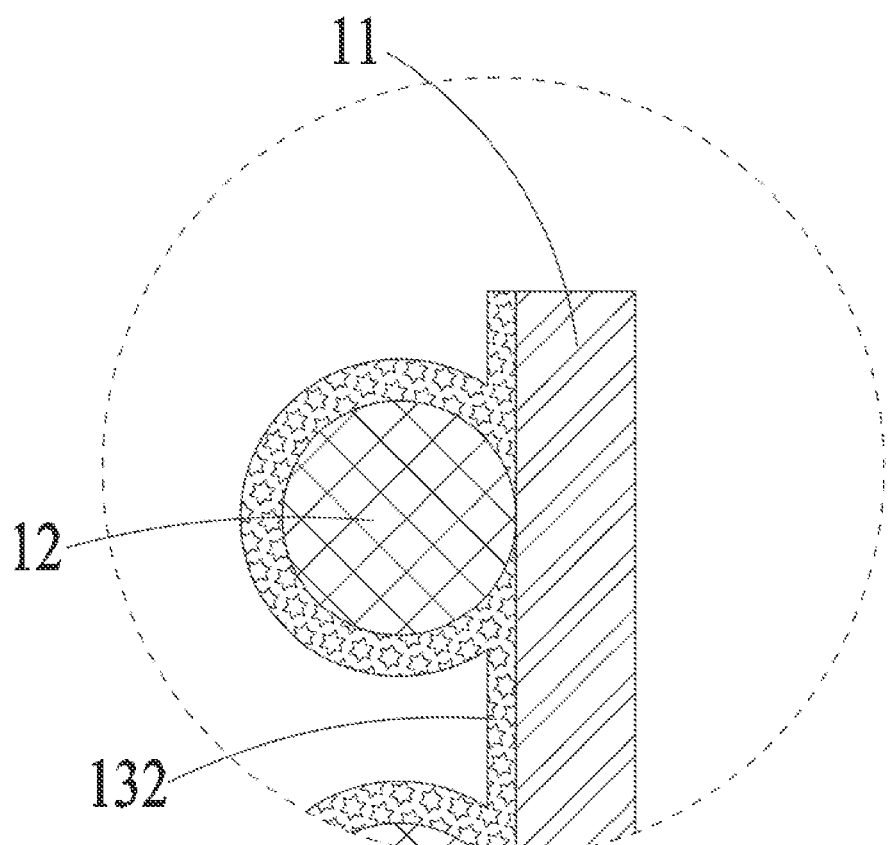

Referring to FIGS. 4-6, FIG. 4 shows a first schematic top view of the supporting film provided by an embodiment of the present application. FIG. 5 shows a schematic cross-sectional view of a structure shown in FIG. 4 along an A-A direction. FIG. 6 shows a schematic diagram of an enlarged structure of an area B in FIG. 5. The supporting film 10 may comprise a flexible substrate 11 and a plurality of metal strips 12, and each of the plurality of metal strips 12 is connected with the flexible substrate 11.

Illustratively, the flexible substrate 11 is a polymer material with good flexibility, such as polyethylene terephthalate (PET), polyimide (PI), etc. The metal strips 12 may be made of stainless steel. It can be understood that stainless steel has good corrosion resistance, so that the metal strips 12 have a relatively long service life. Of course, the metal strips 12 can also be made of other metals, such as copper, gold, and silver.

Illustratively, the plurality of metal strips 12 are connected with the flexible substrate 11 through an adhesive layer 130.

Referring to FIG. 4, the adhesive layer 130 may comprise a first adhesive layer 131 and a second adhesive layer 132 arranged at intervals, one end of each of the plurality of metal strips 12 is connected with the flexible substrate 11 through the first adhesive layer 131, and another end of each of the plurality of metal strips 12 is connected with the flexible substrate 11 through the second adhesive layer 132.

Referring to FIG. 4, the plurality of metal strips 12 are parallel to each other, the plurality of metal strips 12 are cylindrical, each of the plurality of metal strips 12 has a cross-sectional diameter of 0.2 mm to 2 mm (for example, 0.2 mm, 0.2 mm, 0.4 mm, 0.6 mm, 0.8 mm, 1.0 mm, 1.2 mm, 1.4 mm, 1.6 mm, 1.8 mm, 2 mm, etc.), and a distance between centers of two adjacent metal strips 12 is 0.7 mm to 6 mm (for example, 0.7 mm, 0.9 mm, 1.0 mm, 1.5 mm, 2 mm, 2.5 mm, 3 mm, 3.5 mm, 4 mm, 4.5 mm, 5 mm, 5.5 mm, 6 mm, etc.).

Illustratively, both the first adhesive layer 131 and the second adhesive layer 132 have a width of 10 mm to 30 mm (for example, 10 mm, 12 mm, 15 mm, 17 mm, 20 mm, 22 mm, 24 mm, 26 mm, 28 mm, 30 mm, etc.) along an extending direction of the metal strips 12, and both the first adhesive layer 131 and the second adhesive layer 132 have a thickness of 0.03 mm to 0.1 mm (for example, 0.03 mm, 0.04 mm, 0.05 mm, 0.06 mm, 0.07 mm, 0.08 mm, 0.09 mm, 0.1 mm, etc.).

Referring to FIG. 4, both the first adhesive layer 131 and the second adhesive layer 132 may be strip-shaped, and an extending direction of both the first adhesive layer 131 and the second adhesive layer 132 is perpendicular to the extending direction of the metal strips 12.

Illustratively, both the first adhesive layer 131 and the second adhesive layer 132 may be rectangular.

In some embodiments, a first adhesive layer 131 and a second adhesive layer 132 may be prepared by the following method: placing a plurality of metal strips 12 on an upper surface of a flexible substrate 11 according to a preset position and spraying/coating glue on the metal strips 12 and the flexible substrate 11 according to preset areas of the first adhesive layer 131 and the second adhesive layer 132. The glue sprayed/coated on the metal strip 12 will slide down onto the flexible substrate 11 based on its own fluidity and gather with the glue sprayed/coated on the flexible substrate 11 to form a film layer. After curing, the first adhesive layer 131 and the second adhesive layer 132 are formed according to the preset areas. The adhesive layer 131 and the second adhesive layer 132 can play a role of bonding between the metal strips 12 and the flexible substrate 11, thereby achieving a purpose of fixing the metal strips 12 on the flexible substrate 11. As shown in FIG. 2, after the first adhesive layer 131 and the second adhesive layer 132 are prepared by the above method, a layer of cured glue will also remain on a surface of the metal strips 12. For the first adhesive layer 131 or the second adhesive layer 132 prepared by this method, it can be understood that thicknesses of different areas of the first adhesive layer 131 or the second adhesive layer 132 are different. An area directly below the metal strips 12 on the first adhesive layer 131/the second adhesive layer 132 has a relatively small thickness, and the area between two adjacent metal strips 12 on the first adhesive layer 131/the second adhesive layer 132 has a relatively large thickness. The above-mentioned "the thickness of both the first adhesive layer 131 and the second adhesive layer 132 can be 0.03 mm to 0.1 mm" specifically means that the thickness of the area between two adjacent metal strips 12 on the first adhesive layer 131/the second adhesive layer 132 can be 0.03 mm to 0.1 mm. In this embodiment, both the first adhesive layer 131 and the second adhesive layer 132 comprise a first part wrapping the plurality of metal strips 12, a second part between lower surfaces of the metal strips 12 and the flexible substrate 11, and a third part between the plurality of metal strips 12.

In other embodiments, a first adhesive layer 131 and a second adhesive layer 132 may also be prepared by the following method: firstly, attaching an adhesive film or coating glue on a flexible substrate 11 according to the preset areas of the first adhesive layer 131 and the second adhesive layer 132 to form a first adhesive layer 131 and a second adhesive layer 132. Then, placing a plurality of metal strips 12 on the flexible substrate 11 according to a preset position.

Since the first adhesive layer 131 and the second adhesive layer 132 are respectively arranged corresponding to both ends of the metal strips 12, both ends of the metal strips 12 can be bonded to the flexible substrate 11 through the first adhesive layer 131 and the second adhesive layer 132, respectively. For the first adhesive layer 131 or the second adhesive layer 132 prepared by the above method, it can be understood that the thickness of all areas of the first adhesive layer 131 or the second adhesive layer 132 is uniform. In this embodiment, both the first adhesive layer 131 and the second adhesive layer 132 are disposed between the metal strips 12 and the flexible substrate 11.

Figure 7:
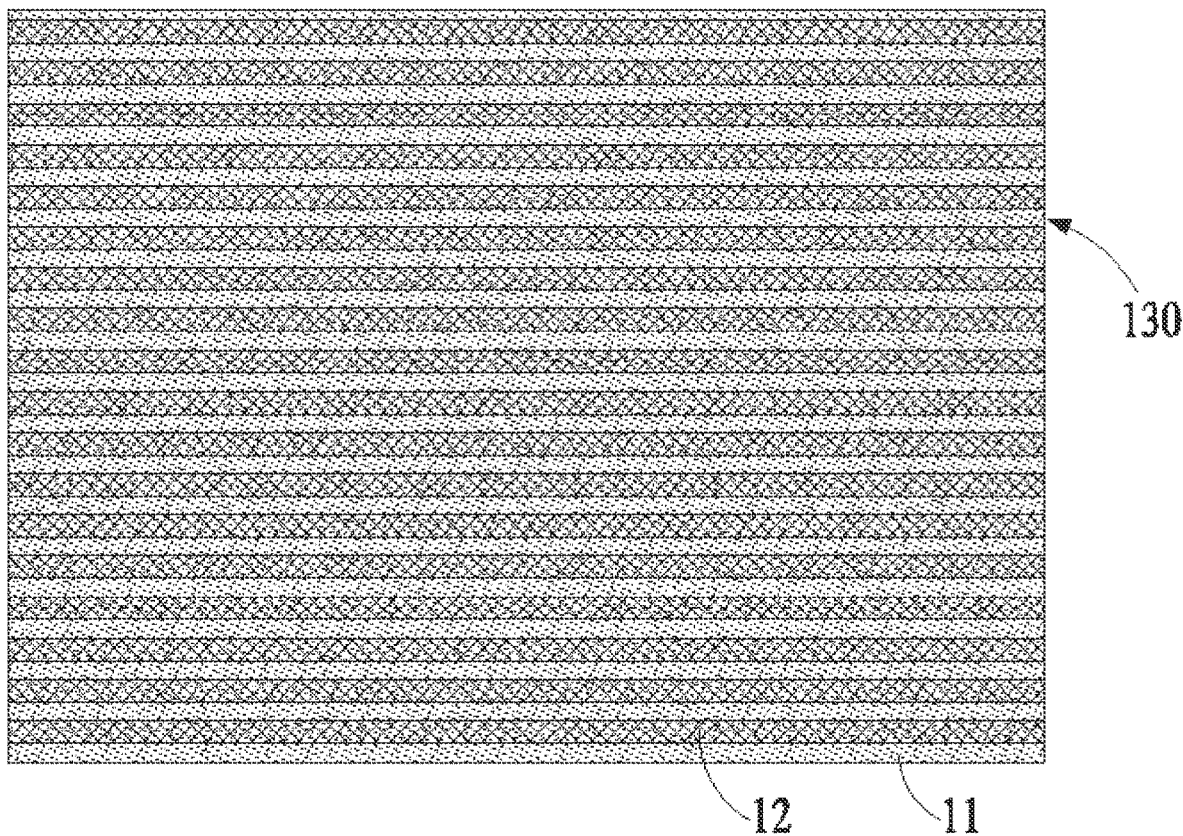

Referring to FIG. 7, which shows a second schematic top view of the supporting film provided by an embodiment of the present application. An adhesive layer 130 may cover an entire surface of the flexible substrate 11. As shown in FIG. 7, the adhesive layer 130 can be prepared by methods as follows: spraying or coating glue on a plurality of metal strips 12 and a flexible substrate 11 to form an adhesive layer covering the metal strips 12 and the flexible substrate 11. Since the glue has fluidity, it can be understood that the glue will wrap the plurality of metal strips 12, fill a space between lower surfaces of the plurality of metal strips 12 and the flexible substrate 11, and meanwhile distribute among the plurality of metal strips 12 to form an entire continuous adhesive layer, which is cured to form an adhesive layer 130. That is to say, the prepared adhesive layer 130 comprises a first area wrapping the plurality of metal strips 12, a second area between the lower surfaces of the plurality of metal strips 12 and the flexible substrate 11, and a third area between the plurality of metal strips 12. Of course, the adhesive layer 130 may also be a preformed adhesive film. In this case, the adhesive layer 130 may be disposed between the plurality of metal strips 12 and the flexible substrate 11.

Illustratively, the flexible substrate 11 has a thickness of 0.1 mm to 1 mm (for example, 0.1 mm, 0.2 mm, 0.3 mm, 0.4 mm, 0.5 mm, 0.6 mm, 0.7 mm, 0.8 mm, 0.9 mm, 1 mm, etc.).

Illustratively, the display layer is an OLED display layer. The OLED display layer may comprise an anode, a hole injection layer, a hole transport layer, a light emitting layer, an electron transport layer, an electron injection layer, and a cathode that are stacked in sequence.

Illustratively, the flexible substrate 21 may be an organic material such as polyimide (PI).

Please refer to FIG. 1 in combination, the flexible display panel 20 may further comprise a polarizer 23, which is disposed on one side of the display layer 22 away from the flexible substrate 21. The polarizer 23 can be a circular polarizer, which is usually an anti-reflection sheet formed by combining a ¼ wavelength phase film with a traditional polarizer. The circular polarizer can reduce interference of ambient light on a display picture of an OLED display screen, and improve a display effect of the OLED display screen in a bright environment.

Please refer to FIG. 1 in combination, the flexible display device 100 further comprises a driving circuit board 30 electrically connected with the flexible display panel 20, and the driving circuit board 30 is used to drive the flexible display panel 20 for displaying, the driving circuit board 30 can be arranged on one side of the flexible display panel 20, and the driving circuit board 30 can be electrically connected with the flexible display panel 20 through a flexible circuit board 40.

Illustratively, the driving circuit board 30 can be a printed circuit board (PCB), and the flexible circuit board 40 can be a chip on film (COF).

Figure 8:
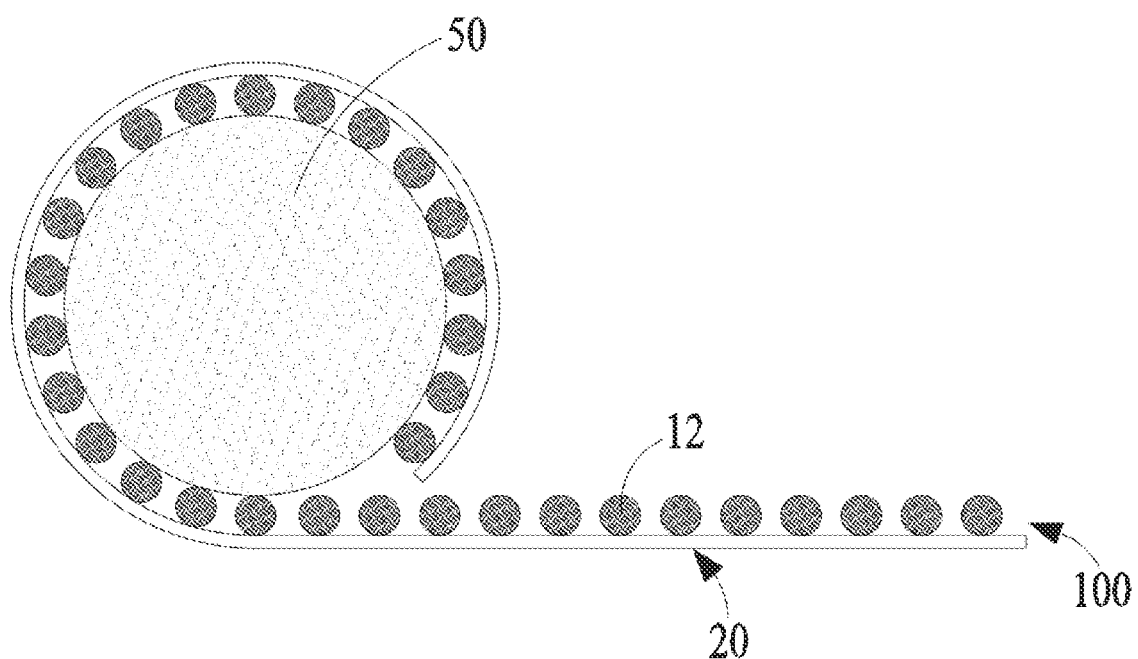

Referring to FIG. 8, which shows a schematic diagram of a curling effect of the flexible display device provided by an embodiment of the present application. It can be seen that the flexible display device 100 provided by the embodiment of the present application has good bending performance, and can be curled on a reel 50. Furthermore, as can be seen from FIG. 8, the metal strips 12 and the flexible display panel 20 have a relatively small contact area, so during the curling process of the flexible display panel 20, stress applied to a contact position of the flexible display panel 20 and the metal strips 12 is relatively small, so that the flexible display panel 20 will not be damaged.

In some embodiments, a driving device (not shown) may be provided to drive the reel 50 to rotate. Illustratively, when the reel 50 rotates in a clockwise (or counterclockwise) direction, the flexible display device 100 gradually unfolds to form a flat or curved display effect according to actual needs. When the reel 50 rotates in a counterclockwise (or clockwise) direction, the flexible display device 100 gradually retracts, and is wound round by round on the reel 50, and finally stores in a cylindrical shape.

The flexible display device 100 provided by the embodiment of the present application supports and reinforces the flexible display panel 20 by adopting an innovatively designed supporting film 10, which comprises a flexible substrate 11 and a plurality of metal strips 12 connected with the flexible substrate. Compared with a traditional supporting film, supporting film 10 in the present application has better bending properties, so that the curling radius of the flexible display panel 20 can be greatly reduced to less than 3 mm. In addition, since supporting film 10 in the present application adopts a flexible substrate 11 as a substrate, the supporting film 10 has better flexibility, so it does not easily break during use. Furthermore, since the supporting film 10 is not provided with a hollow pattern, when curling the flexible display device 100, stress applied to different areas of the flexible display panel 20 is uniform, thus causing no damage to the flexible display panel.

The flexible display device provided by the embodiment of the present application is described in detail above. In the present application, specific embodiments are applied to illustrate the principle and implementation of the present application, and the above embodiments are only used to help to understand the present application. At the same time, for those skilled in the art, there may be some variations in the specific implementation and application scope according to the ideas of the present application. In summary, the contents of the present specification should not be construed as limitations of the present application.

What is claimed is:

1. A flexible display device, comprising:
   a flexible display panel; and
   a supporting film, wherein the supporting film and the flexible display panel are stacked, and the supporting film is used to support the flexible display panel; and
   the supporting film comprises a flexible substrate and a plurality of metal strips, and each of the plurality of metal strips is connected with the flexible substrate;
   wherein the plurality of metal strips are connected with the flexible substrate through an adhesive layer;
   wherein the adhesive layer entirely covers a surface of the flexible substrate; and
   wherein the adhesive layer is disposed between the plurality of metal strips and the flexible substrate.

2. The flexible display device of claim 1, wherein the adhesive layer comprises a first adhesive layer and a second adhesive layer arranged at intervals, one end of each of the plurality of metal strips is connected with the flexible substrate through the first adhesive layer, and another end of each of the plurality of metal strips is connected with the flexible substrate through the second adhesive layer.

3. The flexible display device of claim 2, wherein both the first adhesive layer and the second adhesive layer have a width of 10 mm to 30 mm along an extending direction of the metal strips, and both the first adhesive layer and the second adhesive layer have a thickness of 0.03 mm to 0.1 mm.

4. The flexible display device of claim 2, wherein both the first adhesive layer and the second adhesive layer comprise a first part wrapping the plurality of metal strips, a second part between lower surfaces of the plurality of metal strips and the flexible substrate, and a third part between the plurality of metal strips.

5. The flexible display device of claim 2, wherein both the first adhesive layer and the second adhesive layer are disposed between the plurality of metal strips and the flexible substrate.

6. The flexible display device of claim 2, wherein extending directions of both the first adhesive layer and the second adhesive layer are perpendicular to an extending direction of the metal strips.

7. The flexible display device of claim 1, wherein the plurality of metal strips are parallel to each other, the plurality of metal strips are cylindrical, each of the metal strips has a cross-sectional diameter of 0.2 mm to 2 mm, and a distance between centers of two adjacent metal strips is 0.7 mm to 6 mm.

8. The flexible display device of claim 1, wherein the adhesive layer comprises a first area wrapping the plurality of metal strips, a second area between lower surfaces of the plurality of metal strips and the flexible substrate, and a third area between the plurality of metal strips.

9. The flexible display device of claim 1, wherein, the flexible substrate is a polymer material.

10. The flexible display device of claim 1, wherein the flexible substrate has a thickness of 0.1 mm to 1 mm.

11. The flexible display device of claim 1, wherein the flexible substrate is a polyethylene terephthalate film.

12. The flexible display device of claim 1, wherein a material of the metal strip is stainless steel.

13. The flexible display device of claim 1, wherein the flexible display panel comprises a flexible substrate and a display layer, the flexible substrate is provided on one side of the supporting film, and the display layer is provided on one side of the flexible substrate away from the supporting film.

14. The flexible display device of claim 13, wherein the display layer is an organic light emitting diode display layer.

15. The flexible display device of claim 14, wherein the organic light emitting diode display layer comprises an anode, a hole injection layer, a hole transport layer, a light emitting layer, an electron transport layer, an electron injection layer, and a cathode that are stacked in sequence.

16. The flexible display device of claim 13, wherein the flexible substrate is an organic material.

17. The flexible display device of claim 1, wherein the flexible display device further comprises a driving circuit board electrically connected with the flexible display panel, and the driving circuit board is used to drive the flexible display panel for displaying, the driving circuit board is arranged on one side of the flexible display panel, and the driving circuit board is electrically connected with the flexible display panel through a flexible circuit board.

18. A flexible display device, comprising:
a flexible display panel; and
a supporting film, wherein the supporting film and the flexible display panel are stacked, and the supporting film is used to support the flexible display panel; and the supporting film comprises a flexible substrate and a plurality of metal strips, and each of the plurality of metal strips is connected with the flexible substrate;
wherein the flexible display panel comprises a flexible substrate and a display layer, the flexible substrate is provided on one side of the supporting film, and the display layer is provided on one side of the flexible substrate away from the supporting film.

19. A flexible display device, comprising:
a flexible display panel; and
a supporting film, wherein the supporting film and the flexible display panel are stacked, and the supporting film is used to support the flexible display panel; and the supporting film comprises a flexible substrate and a plurality of metal strips, and each of the plurality of metal strips is connected with the flexible substrate;
wherein the flexible display device further comprises a driving circuit board electrically connected with the flexible display panel, and the driving circuit board is used to drive the flexible display panel for displaying, the driving circuit board is arranged on one side of the flexible display panel, and the driving circuit board is electrically connected with the flexible display panel through a flexible circuit board.

* * * * *